US010600928B1

(12) United States Patent
Walker et al.

(10) Patent No.: US 10,600,928 B1
(45) Date of Patent: Mar. 24, 2020

(54) SYSTEMS WITH PHOTOVOLTAIC CELLS

(71) Applicant: Apple Inc., Cupertino, CA (US)

(72) Inventors: Joseph B. Walker, Campbell, CA (US); Kathleen A. Bergeron, Los Gatos, CA (US); Daniel D. Sunshine, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 57 days.

(21) Appl. No.: 15/677,947

(22) Filed: Aug. 15, 2017

Related U.S. Application Data

(60) Provisional application No. 62/397,098, filed on Sep. 20, 2016.

(51) Int. Cl.
| | | |
|---|---|---|
| *H01L 31/0392* | (2006.01) | |
| *H01L 31/02* | (2006.01) | |
| *H01L 31/0445* | (2014.01) | |
| *H01L 31/053* | (2014.01) | |
| *H02J 7/35* | (2006.01) | |

(Continued)

(52) U.S. Cl.
CPC ........ *H01L 31/03926* (2013.01); *B60R 16/03* (2013.01); *D03D 1/0076* (2013.01); *D03D 1/0088* (2013.01); *G06F 1/1633* (2013.01); *H01L 31/02021* (2013.01); *H01L 31/0445* (2014.12); *H01L 31/053* (2014.12); *H02J 7/35* (2013.01); *H01L 31/0296* (2013.01); *H01L 31/0322* (2013.01)

(58) Field of Classification Search
CPC ............. H01L 31/03926; H01L 31/042; H01L 31/02021; H01L 31/053; H01L 31/0445; H01L 31/0296; H01L 31/0322; H02J 3/383; H02J 7/35; D03D 1/0076; D03D 1/0088; B60R 16/03; G06F 1/1633
USPC .......................................... 320/101; 136/244
See application file for complete search history.

(56) References Cited

U.S. PATENT DOCUMENTS

| | | | | |
|---|---|---|---|---|
| 4,781,766 A | | 11/1988 | Barnett et al. | |
| 4,913,744 A | * | 4/1990 | Hoegl | H01L 27/304 136/244 |

(Continued)

OTHER PUBLICATIONS

Jean et al., In situ vapor-deposited parylene substrates for ultra-thin, lightweight organic solar cells, Organic Electronics, 2016, vol. 31, pp. 120-126.

*Primary Examiner* — M Baye Diao
(74) *Attorney, Agent, or Firm* — Treyz Law Group, P.C.; Kendall W. Abbasi

(57) ABSTRACT

An item may include circuitry, a battery that powers the circuitry, and one or more photovoltaic cells that are used to recharge the battery. The photovoltaic cell may be a thin-film photovoltaic cell with a flexible substrate. The flexible substrate may be formed from fabric, leather, polymer, or other soft materials. In arrangements where the substrate is formed from fabric with conductive strands, the photovoltaic cell may include a first electrical terminal coupled to a first conductive strand and a second electrical terminal coupled to a second conductive strand. The first and second conductive strands may be coupled to control circuitry. The control circuitry may route the electricity from the photovoltaic cell to a battery or other circuitry. Items such as cases, covers, bands, headphones, interiors, and other items may have flexible or soft surfaces that can form substrates for photovoltaic films.

17 Claims, 8 Drawing Sheets

(51) Int. Cl.
  *D03D 1/00* (2006.01)
  *G06F 1/16* (2006.01)
  *B60R 16/03* (2006.01)
  *H01L 31/032* (2006.01)
  *H01L 31/0296* (2006.01)

(56) References Cited

U.S. PATENT DOCUMENTS

| | | | | |
|---|---|---|---|---|
| 5,057,163 | A * | 10/1991 | Barnett | H01L 31/022425 |
| | | | | 136/256 |
| 5,273,911 | A * | 12/1993 | Sasaki | C23C 14/568 |
| | | | | 136/244 |
| 5,300,875 | A * | 4/1994 | Tuttle | H04B 1/3888 |
| | | | | 320/138 |
| 5,377,037 | A * | 12/1994 | Branz | G02C 7/101 |
| | | | | 351/45 |
| 7,064,299 | B2 * | 6/2006 | Green | H05B 3/347 |
| | | | | 219/515 |
| 7,086,749 | B1 * | 8/2006 | Hanley | A42B 1/244 |
| | | | | 362/105 |
| 7,433,655 | B2 * | 10/2008 | Jacobs | A61N 1/3787 |
| | | | | 320/101 |
| 7,851,700 | B2 | 12/2010 | Luch | |
| 8,389,862 | B2 | 3/2013 | Arora et al. | |
| 8,445,388 | B2 * | 5/2013 | Fox | H01L 21/02485 |
| | | | | 257/E21.017 |
| 8,536,667 | B2 * | 9/2013 | de Graff | H01L 27/14687 |
| | | | | 257/419 |
| 8,709,841 | B2 * | 4/2014 | Nakata | D03D 1/0076 |
| | | | | 438/26 |
| 8,886,334 | B2 * | 11/2014 | Ghaffari | A61B 1/00082 |
| | | | | 607/115 |
| 9,013,301 | B2 * | 4/2015 | Williams | B62H 5/00 |
| | | | | 340/539.13 |
| 9,422,922 | B2 * | 8/2016 | Sant'Anselmo | F03D 9/11 |
| 9,590,133 | B1 * | 3/2017 | Welser | G02B 1/115 |
| 9,865,758 | B2 * | 1/2018 | Luch | H01L 31/0508 |
| 2004/0029326 | A1 * | 2/2004 | Voutsas | G11C 13/0007 |
| | | | | 438/151 |
| 2007/0012349 | A1 * | 1/2007 | Gaudiana | G06Q 30/00 |
| | | | | 136/244 |
| 2007/0068567 | A1 * | 3/2007 | Rubin | H02S 50/10 |
| | | | | 136/243 |
| 2007/0069883 | A1 * | 3/2007 | Collier, Jr. | G06F 1/3203 |
| | | | | 340/538 |
| 2007/0148336 | A1 * | 6/2007 | Bachrach | C23C 14/35 |
| | | | | 427/97.1 |
| 2008/0020782 | A1 * | 1/2008 | Nasser | G08B 3/10 |
| | | | | 455/456.1 |
| 2009/0050204 | A1 | 2/2009 | Habib | |
| 2010/0144268 | A1 * | 6/2010 | Haberli | H04B 13/005 |
| | | | | 455/41.1 |
| 2010/0212718 | A1 * | 8/2010 | Houghton | H01L 31/035281 |
| | | | | 136/246 |
| 2011/0315204 | A1 * | 12/2011 | Gleason | B82Y 10/00 |
| | | | | 136/256 |
| 2012/0113559 | A1 * | 5/2012 | Nguyen | H01L 21/67748 |
| | | | | 361/221 |
| 2012/0295396 | A1 * | 11/2012 | Teeter | C23C 14/0629 |
| | | | | 438/95 |
| 2015/0036204 | A1 * | 2/2015 | Branda | G02B 5/23 |
| | | | | 359/244 |
| 2016/0001069 | A1 * | 1/2016 | Fletcher | A61N 1/303 |
| | | | | 604/20 |
| 2016/0204304 | A1 | 7/2016 | Gunawan et al. | |

* cited by examiner

SYSTEMS WITH PHOTOVOLTAIC CELLS

This application claims the benefit of provisional patent application No. 62/397,098, filed Sep. 20, 2016, which is hereby incorporated by reference herein in its entirety.

FIELD

This relates generally to electronic devices and, more particularly, to electronic devices with photovoltaic cells.

BACKGROUND

It may be desirable to transfer power between a source of power and circuitry that requires power. In some systems, a user must manually plug a power cable into equipment that requires power. In other systems, a user must align equipment to be powered with a wireless charging source. These types of systems can be cumbersome for users. For example, a user may not always have a power cable on hand or may not always be near a wireless charging source.

Photovoltaic cells are sometimes used to provide power for electronic equipment. However, it can be challenging to incorporate photovoltaic cells into different types of electronic equipment. For example, photovoltaic cells can be insufficiently flexible or overly bulky.

SUMMARY

An item may include circuitry, a battery that powers the circuitry, and a photovoltaic cell that is used to recharge the battery. The photovoltaic cell may be a thin-film photovoltaic cell with a flexible substrate. The flexible substrate may be formed from fabric, leather, polymer, or other soft materials.

A fabric-based item may have fabric with conductive strands and insulating strands. The conductive strands may form conductive signal paths and may be coupled to control circuitry. A photovoltaic cell may include a first electrical terminal coupled to a first conductive strand and a second electrical terminal coupled to a second conductive strand. The first and second conductive strands may be coupled to control circuitry. The control circuitry may route the electricity from the photovoltaic cell to a battery or other circuitry.

Items such as cases, covers, bands, headphones, interiors, and other items may have flexible or soft surfaces that can form substrates for photovoltaic films.

DETAILED DESCRIPTION

Items such as electronic devices, accessories, clothing, vehicles, and other items may include photovoltaic cells and other circuitry. A photovoltaic cell may be used as a light sensor, may be used to charge a battery, or may be used to power other circuitry in the item.

Photovoltaic cells may be incorporated into flexible items such as fabric-based items and other flexible items. Photovoltaic cells may be thin-film photovoltaic cells formed from thin-film layers that have been deposited on flexible substrates. The flexible substrate may be formed from a strand in a layer of fabric, a woven fabric, a leather or other soft material, a flexible polymer, or other flexible substrate.

Figure 1:
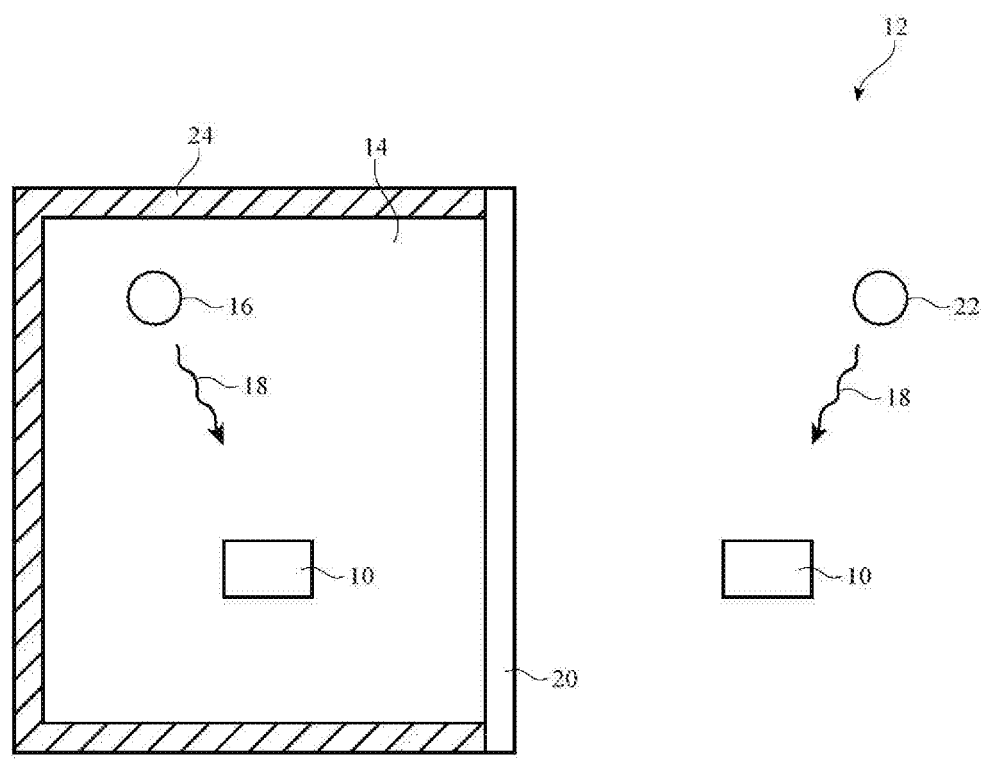
FIG. 1 is a diagram of an illustrative system in accordance with an embodiment.

A diagram of an illustrative operating environment in which electronic equipment with photovoltaic cells may operate is shown in FIG. 1. Electronic devices 10 may operate in outdoor environments such as outdoor environment 12 and indoor environments such as indoor environment 14. Indoor environment 14 may be the inside of a room, a building, a vehicle, or other enclosure 24.

Outdoor environment 12 may be include one or more outdoor light sources such as light source 22. Light source 22 may be the sun, a street light, or other outdoor source of illumination 18. Objects in outdoor environment 12 such as object 10 may be illuminated by light 18 from outdoor light source 22. Indoor environment 14 may include one or more indoor light sources such as interior light source 16. Light source 16 may be formed from one or more light-emitting diodes (e.g., red, green, and/or blue light-emitting diodes, white light-emitting diodes, etc.) or other source of illumination. Light source 16, which may sometimes be referred to as an interior light source or interior light, may be located in interior 14 and may illuminate interior objects in interior 14 such as object 10. Object 10 may also receive light 18 from outdoor light source 22 through a window such as window 20.

Objects 10 may be configured to generate electricity using light 18. For example, objects 10 may include one or more photovoltaic cells that convert light 18 into electricity. The electricity may be used to recharge a battery or to provide power to circuitry in object 10 or to circuitry in another object.

Figure 2:
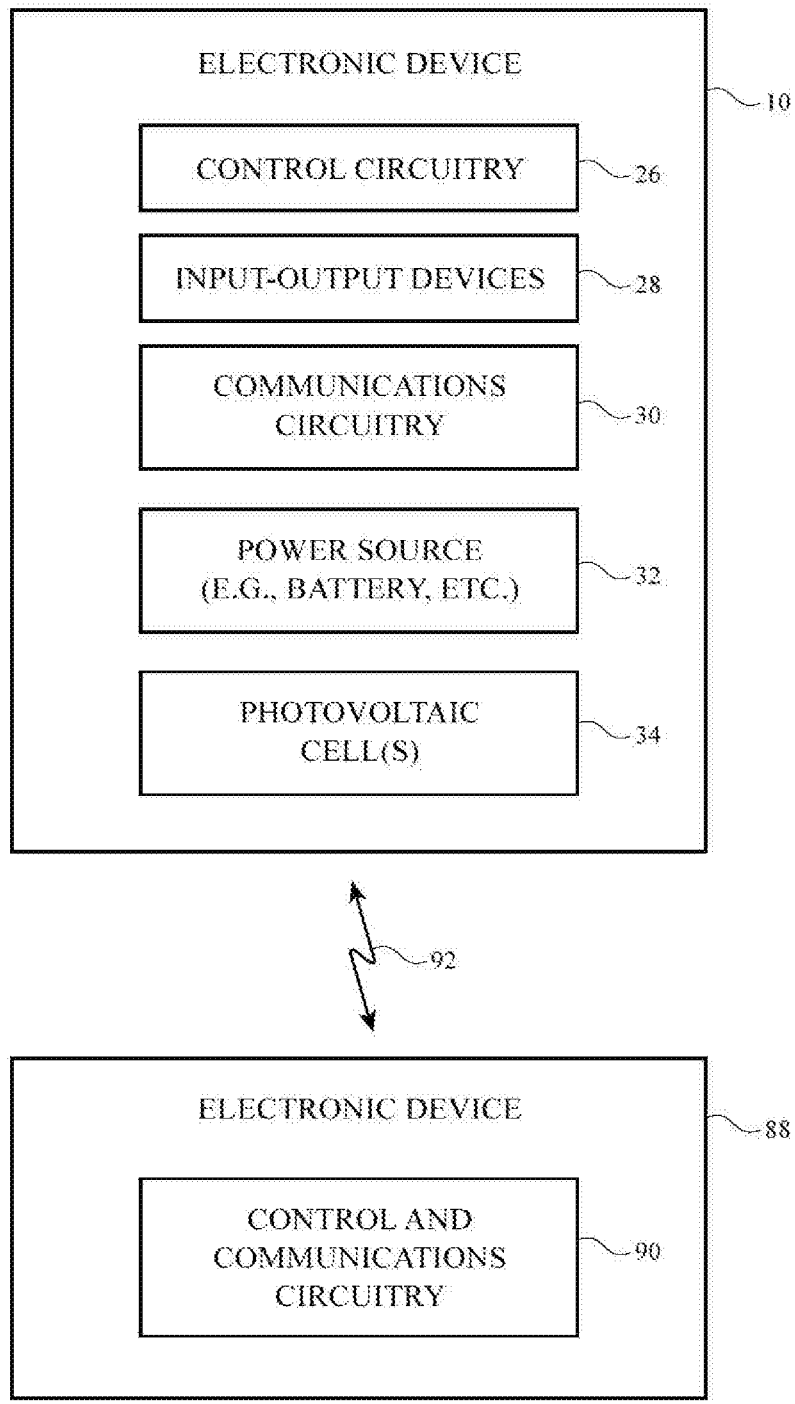
FIG. 2 is a schematic diagram of an illustrative electronic device that may operate in the system of FIG. 1 in accordance with an embodiment.

A schematic diagram of illustrative components that may be provided in objects 10 of the type shown in FIG. 1 is shown in FIG. 2. Electronic device 10 of FIG. 2 may be an electronic device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic device 10 is mounted in a kiosk, in an automobile, airplane, or other vehicle, other electronic equipment, or equipment that implements the functionality of two or more of these devices. If desired, electronic device 10 may be a removable external case for electronic equipment or other device accessory, may be a strap, may be a wrist band or head band, may be a removable cover for a device, may be a case, backpack, or bag that has straps or that has other structures to receive and carry electronic equipment and other items, may be a necklace or arm band, may be a wallet, sleeve, pocket, or other structure into which electronic equipment or other items may be inserted, may be a tent, a sleeping bag, or other camping equipment, may be part of a chair, sofa, or other seating (e.g., cushions or other seating structures), may be part of an item of clothing or other wearable item (e.g., a hat, belt, wrist band, headband, shirt, pants, shoes, etc.), may be a keyboard, or may be any other suitable device that includes circuitry.

As shown in FIG. 2, electronic device 10 may have control circuitry 26. Control circuitry 26 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 26 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 28 may be used to allow data to be supplied to device 10 and to allow data to be provided from device 10 to external devices. Input-output devices 28 may include buttons, joysticks, scrolling wheels, touch sensors that are configured to serve as touch pads and other touch sensitive input devices, key pads, keyboards, microphones, speakers, tone generators, vibrators, cameras, sensors, light-emitting diodes and other light-emitting components, displays, data ports, etc.

Communications circuitry 30 may be used to transmit information from device 10 to other electronic equipment 88 and/or may be used to receive information from equipment 88 or other external equipment. For example, sensor data, other data, control information, and other information may be supplied from device 10 to corresponding control circuitry 90 in equipment 88 over wireless communications link 92 and/or sensor data, control information, and other information may be supplied from control circuitry 90 in equipment 88 to control circuitry 26 in device 10 over wireless communications link 92. Communications circuitry 30 may include antennas and wireless local area network transceiver circuitry (e.g., WiFi® circuitry), Bluetooth® transceiver circuitry, cellular telephone transceiver circuitry, other radio-frequency transceiver circuitry (e.g., circuitry operating in bands from 700 MHz to 2700 MHz, below 700 MHz, above 2700 MHz, or other suitable wireless communications frequencies). If desired, circuitry 30 may include light sources and light detectors for handling wireless communications using light. Communications circuitry 30 may also include wired communications circuitry to support communications between device 10 and external equipment over a wired path (e.g., a cable, a signal bus integrated into a shuttle track, etc.).

Power source 32 may be used to supply control circuitry 28 and other components in device 10 with power. Power source 32 may include power storage devices such as batteries, capacitors, etc., may include wireless power receiver circuitry for wirelessly receiving power from other equipment (i.e., device 10 may include a coil and a wireless power receiver to receive transmitted wireless power), may include contacts for receiving power from a bus, or may receive other power source circuitry. Arrangements in which power source 32 is a battery are sometimes described herein as an example.

Electronic device 10 may include one or more photovoltaic cells 34. Photovoltaic cells may be configured to convert light (e.g., light 18 of FIG. 1) into electricity. The electricity may be used to charge battery 32 or may be used to power other circuitry in device 10 such as control circuitry 28 and input-output device 30. Photovoltaic cells 34 may be formed from polycrystalline thin-films and may be relatively thin (e.g., between 1 and 10 microns or other suitable thickness) or photovoltaic cells 34 may be formed from crystalline silicon and may be relatively thick (e.g., between 100 and 300 microns or other suitable thickness).

Figure 3:
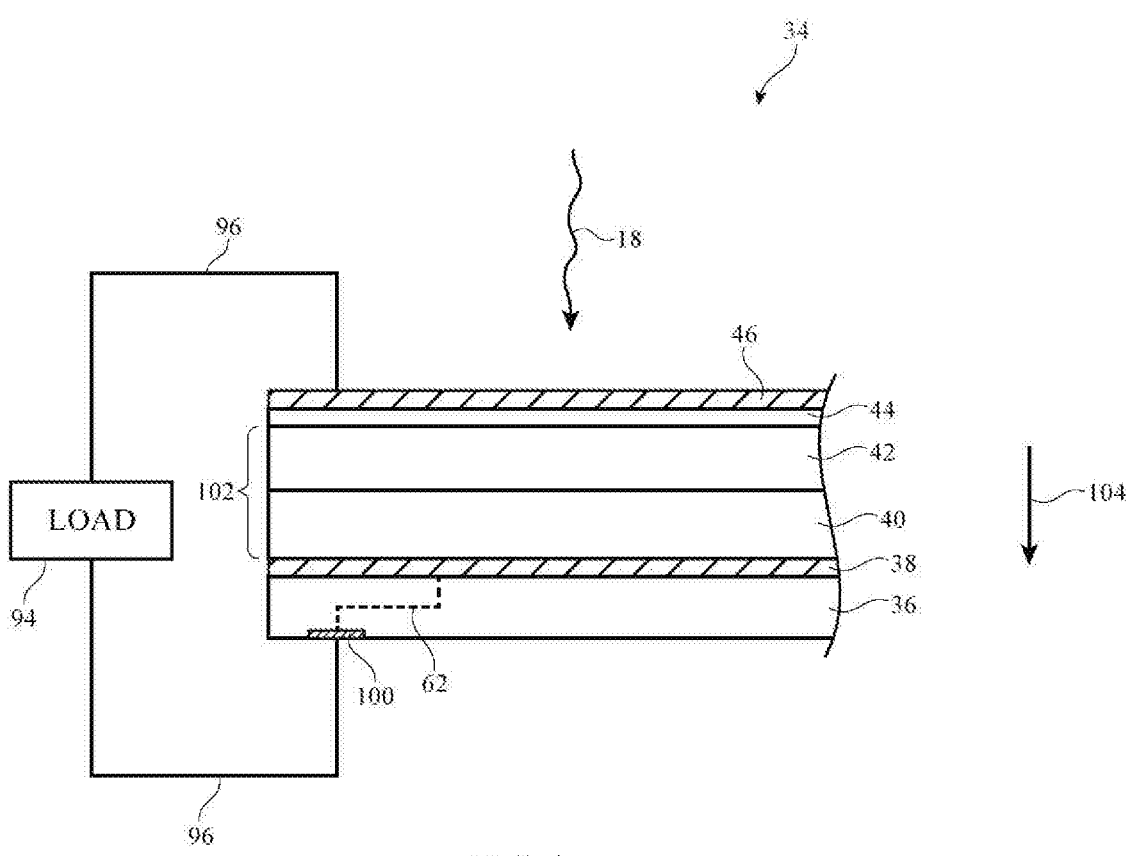
FIG. 3 is a cross-sectional side view of an illustrative photovoltaic cell in accordance with an embodiment.

FIG. 3 is a cross-sectional side view of an illustrative photovoltaic cell. As shown in FIG. 3, photovoltaic cell 34 may include a light-sensitive layer such as light-sensitive layer 102. Light-sensitive layer 102 may be formed from semiconducting materials that form a P-N junction. For example, light-sensitive layer 102 may include semiconductor layers 40 and 42. Lower semiconductor layer 40 may be a P-type semiconductor layer and upper semiconductor layer 42 may be an N-type semiconductor layer, or lower semiconductor layer 40 may be an N-type semiconductor layer and upper semiconductor layer 42 may be a P-type semiconductor layer. Arrangements where upper layer 42 is N-type and lower layer 40 is P-type may be described herein as an example.

Layers 40 and 42 may include semiconductor materials such as amorphous silicon, single-crystalline silicon, thin-film silicon (e.g., nanocrystalline silicon or polycrystalline silicon), cadmium telluride, copper indium diselenide, cadmium sulfide, copper indium gallium diselenide, gallium indium phosphide, gallium arsenide, dye-sensitized solar cell materials, other organic materials, or other suitable materials. As examples, P-type layer 40 may be formed from P-type silicon (e.g., silicon doped with boron) and N-type layer 42 may be formed from N-type silicon (e.g., silicon doped with phosphorous), P-type layer 40 may be formed from copper indium diselenide and N-type layer 42 may be formed from cadmium sulfide, P-type layer 40 may be formed from cadmium telluride and N-type layer 42 may be formed from cadmium sulfide, or layers 40 and 42 may have other suitable combinations of semiconducting materials that form a P-N junction. The P-N junction formed by layers 40 and 42 creates an electric field in direction 104 in layer 102.

Light-sensitive layer 102 may be a single junction photovoltaic cell with one band gap, or light-sensitive layer 102 may be a multijunction photovoltaic cell with multiple bandgaps to capture photons of different energies.

Light-sensitive layer 102 may be sandwiched between conductive layers such as conductive layer 46 (e.g., a negative terminal) and conductive layer 38 (e.g., a positive terminal). Conductive layer 46 and/or conductive layer 38 may be formed from transparent conductive materials such as an indium tin oxide coating, or may be formed from metal such as gold, tungsten, silver, aluminum, or other suitable metal. If desired, backside contact 38 may be formed from a heavily doped region that forms an Ohmic contact. Contacts 46 and 38 may be electrically coupled via signal path 96 and load 94. Load 94 may be any suitable electrical load in device 10 that uses power (e.g., control circuitry 26, input-output devices 28, communications circuitry 30, battery 32, other circuitry, etc.).

Photovoltaic cell 34 may include a substrate such as substrate 36. Substrate 36 may be formed from silicon, glass, metal foil, polymer (e.g., polyimide), fabric, paper, rubber, or other suitable material. Substrate 36 may be rigid or flexible. Substrate 36 may include conductive signal paths such as traces 62 that electrically couple contact 38 to contact 100. Photovoltaic cell 34 may be electrically connected to other circuitry in device 10 such as load 94 using contact 100 on substrate 36. Solder connections, welds, connections formed using connectors, anisotropic conductive film, and other electrical interconnect techniques may be used to couple photovoltaic cell 34 to load 94 (e.g., via contact 100). If desired, load 94 may be mounted directly to substrate 36 and may receive power from cell 34 over traces in substrate 36 such as trace 62.

When light 18 strikes photovoltaic cell 34, electrons may be ejected from the atoms in light-sensitive layer 102. The electric field in light-sensitive layer 102 steers the electrons towards N-type layer 42, causing electric current to flow through path 96 and provide power to load 94.

In addition to or instead of being used as a source of electricity for electronic components in device 10, photovoltaic cell 34 may be used as a light sensor. In particular, a voltage may be generated on photovoltaic cell 34 in response to incoming light 18. Control circuitry 26 may sample this voltage to determine an intensity of incoming light 18. Light intensity measurements gathered using photovoltaic cell 34 may be used to adjust a brightness level of a display in device 10 or to perform other functions.

An optional antireflective film such as antireflective film 44 may be formed over light-sensitive layer 102. If desired, photovoltaic cell 34 may include additional layers of material such as a glass layer, an encapsulation layer, a metal foil layer, a zinc oxide layer, a carbon paste layer, a tin oxide layer or other oxide layer, a cadmium stannate layer, a cadmium sulfide layer, or other layers of material. If desired, one or more of the semiconductor layers in light-sensitive layer 102 may be alloyed with zinc, mercury, or other elements. The example of FIG. 3 is merely illustrative.

Photovoltaic cell 34 may be formed using ingot-growth techniques, may be formed using thin-film deposition techniques (e.g., physical vapor deposition, chemical vapor deposition, electrochemical deposition, a combination of two or more of these techniques, etc.), or may be formed using other suitable techniques.

Thin-film photovoltaic cells may be incorporated into soft and flexible materials. For example, items such as device 10 of FIG. 2 may have one or more portions formed from soft materials such as leather, fabric, flexible polymers, or other flexible materials. The flexible material may form an outer housing or enclosure or may form part of a garment, a car interior, or other surface. It may be desirable to incorporate photovoltaic films in flexible materials. With thin-film deposition techniques, photovoltaic cells may be deposited on flexible substrates. In this way, a flexible material in an electronic device may form substrate 36 of photovoltaic cell 34 to provide a flexible photovoltaic cell on the desired surface of the electronic device or other item.

Figure 4:
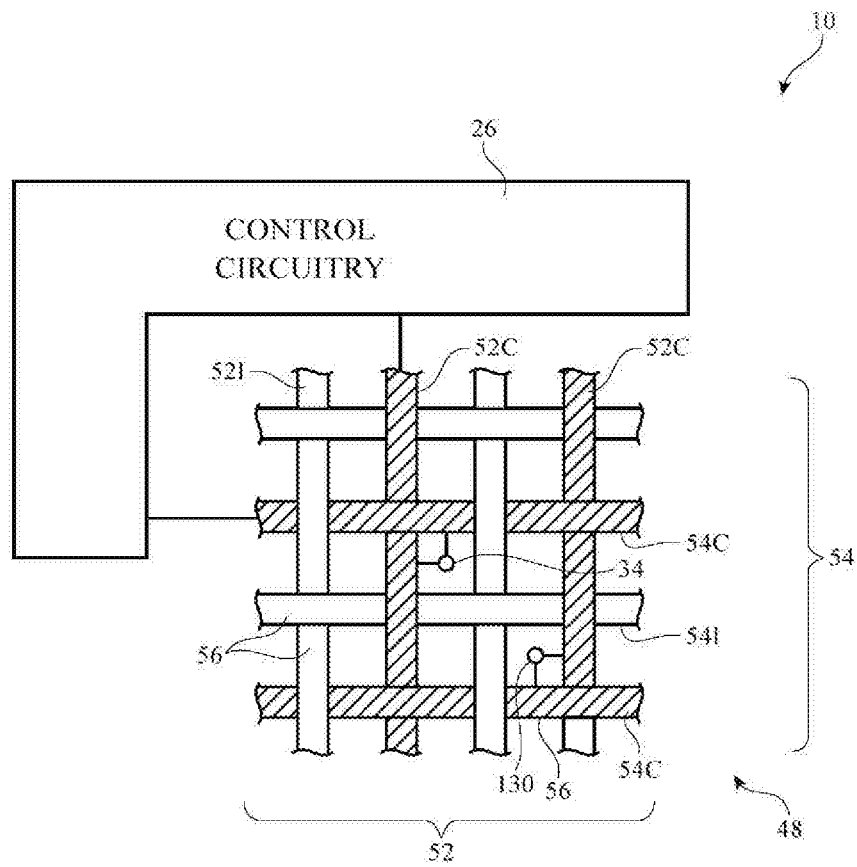
FIG. 4 is a diagram showing how conductive yarn in a fabric may be coupled to control circuitry in accordance with an embodiment.

As shown in FIG. 4, for example, item 10 may include fabric 48 and control circuitry 26. Fabric 48 may be woven fabric, knit fabric, braided material, felt, or other suitable fabric formed from intertwined strands of material such as strands 56. In the illustrative arrangement of FIG. 4, fabric 26 is woven fabric that is formed from warp strands 52 and weft strands 54. Fabric 48 may include insulating strands such as strands 521 and 541 and may include conductive strands such as strands 52C and 54C.

The strands of material in fabric 48 such as strands 56 may each include one or more monofilaments (sometimes referred to as fibers or monofilament fibers). The monofilaments may have one or more layers (e.g., a core layer alone, a core layer with an outer coating, a core layer with an inner coating layer that is covered with an outer coating layer, a core layer coated with three or more additional layers, etc.). Strands of material that are formed from intertwined monofilaments may sometimes be referred to as yarns, threads, multifilament strands or fibers, etc. In general, any suitable types of strands or combination of different types of strands may be used in forming fabric 48 (e.g., monofilaments, yarns formed from multiple monofilaments, etc.). Strands with multiple monofilaments may have 2-200 monofilaments, 2-50 monofilaments, 2-4 monofilaments, 2 monofilaments, 4 monofilaments, fewer than 10 monofilaments, 2-10 monofilaments, fewer than 6 monofilaments, more than 2 monofilaments, or other suitable number of monofilaments.

Insulating strands may be formed from one or more dielectric materials such as polymers, cotton and other natural materials, etc. Conductive strands may be formed from metal or other conductive material and optional dielectric. For example, conductive strands may be formed from solid monofilament wire (e.g., copper wire), wire that is coated with one or more dielectric and/or metal layers (e.g., copper wire that is coated with polymer), a monofilament of polymer coated with metal or other conductive material, a monofilament of polymer coated with metal that is covered with an outer polymer coating, etc. The diameter of the monofilaments may be 5-200 microns, more than 10 microns, 20-30 microns, 30-50 microns, more than 15 microns, less than 200 microns, less than 100 microns, or other suitable diameter. The thickness of each of the coatings in a monofilament may be less than 40% of the diameter of the monofilament, less than 10% of the diameter, less than 4% of the diameter, more than 0.5% of the diameter, 1-5% of the diameter, or other suitable thickness. If desired, conductive monofilaments may be intertwined to form conductive yarn. Conductive yarn may include only conductive monofilaments or may include a combination of conductive monofilaments and insulating monofilaments.

Conductive strands of material in fabric 48 may be used in conveying signals between control circuitry 26 and electrical components such as photovoltaic cell 34, which has a first terminal coupled to conductive strand 52C and a second terminal coupled to conductive strand 54C.

If desired, other electronic components such as electronic component 130 may be coupled to conductive strands in fabric 48. Other components that may be coupled to fabric 48 include input-output components such as buttons, touch sensors, light-based sensors such as light-based proximity sensors, force sensors, environmental sensors such as temperature sensors and humidity sensors, other sensors, status indicator lights and other light-based components such as light-emitting diodes for forming displays and other light-emitting structures, vibrators or other haptic output devices, etc. Electronic component 130 may, for example, form part of communications circuitry 30, input-output devices 28, or other circuitry in device 10.

Electrical components such as photovoltaic cell 34 and electronic component 130 may be attached to fabric 48 using welds, solder joints, adhesive bonds (e.g., conductive adhesive bonds such as anisotropic conductive adhesive bonds or other conductive adhesive bonds), crimped connections, or other electrical and/or mechanical bonds.

Control circuitry 26 may gather electrical signals or other signals from cell 34 and/or other electronic components using conductive strands in fabric 48 or may apply control signals to cell 34 and/or other electronic components using conductive strands in fabric 48 (e.g., to route power signals from photovoltaic cell 34 to other circuitry in device 10 such as input-output devices 28, communications circuitry 30, battery 32, or other circuitry, to light up light-emitting diodes in fabric 48 to display images or other light output on fabric 48, to generate haptic output, etc.).

Figure 5:
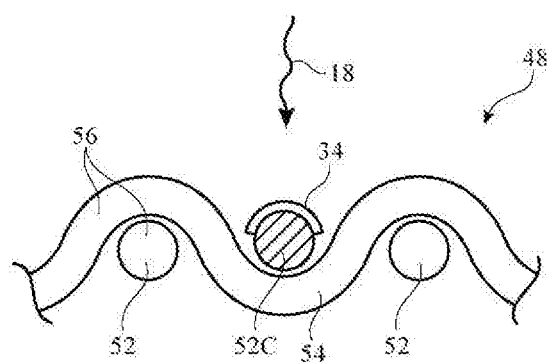
FIG. 5 is a cross-sectional side view of illustrative fabric having a photovoltaic cell on a strand in the fabric in accordance with an embodiment.

A cross-sectional side view of illustrative fabric that includes a photovoltaic cell of the type shown in FIG. 3 is shown in FIG. 5. In the example of FIG. 5, photovoltaic film 34 is formed on an individual strand in fabric 48 such as conductive warp strand 52C. If desired, photovoltaic film 34 may be formed on a conductive weft strand or other conductive strand in fabric 48. The example of FIG. 5 is merely illustrative.

If desired, strand 52C of FIG. 5 may be used as substrate 36 of FIG. 3 (e.g., positive electrode 38 of FIG. 3 may be formed directly on conductive strand 52C). With this type of arrangement, conductive strands in fabric 48 such as strand 52C may form signal paths 62 of FIG. 3 and may be used to convey electricity from positive terminal 38 to load 94 (e.g., input-output devices 28, communications circuitry 30, battery 32, or other circuitry). A second conductive strand in fabric 48 (e.g., conductive weft strand 54C of FIG. 4) may be electrically coupled to negative terminal 46 in photovoltaic cell 34, or a separate conductive path may be coupled to negative terminal 46.

In other arrangements, photovoltaic cell 34 may include a separate substrate that attaches to strand 52C. With this type of arrangement, photovoltaic cell 34 may be electrically coupled to conductive stand 52C via traces 62 in substrate 36 that is separate from strand 52C.

The layers of photovoltaic film 34 may be deposited directly on strand 52C or the layers of photovoltaic cell 34 may be deposited on a carrier substrate and then transferred from the carrier substrate to strand 52C. Photovoltaic cell 34 may be formed on strand 52C before or after strand 52C is intertwined with other strands 56 (e.g., before or after weaving, knitting, braiding, etc.).

Electrical signals from photovoltaic cell 34 may be carried from cell 34 to load 94 over conductive strand 52C. This is, however, merely illustrative. If desired, photovoltaic cell 34 may be mounted on strands in fabric 48 without having the electrical signals carried by strands in the fabric (e.g., a separate substrate on strands 56 may convey signals between photovoltaic cell 34 and load 94).

In the example of FIG. 5, photovoltaic cell 34 only wraps partially around strand 52C. If desired, photovoltaic cell 34 may wrap entirely around a strand in fabric 48, as shown in FIG. 6.

Figure 6:
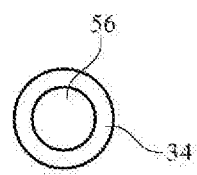
FIG. 6 is a cross-sectional side view of an illustrative strand that is coated with a photovoltaic film in accordance with an embodiment.

Photovoltaic cells of FIGS. 5 and 6 may extend continuously along the length of strand 56, may be multiple discrete cells distributed along the length of strands 56, may be distributed among both warp strands 52 and weft strands 54, may cover every strand 56 in fabric 48 or only 10%, 20%, 50%, 80%, or other suitable percentage of strands 56 in fabric 48, or may have other suitable configurations.

Figure 7:
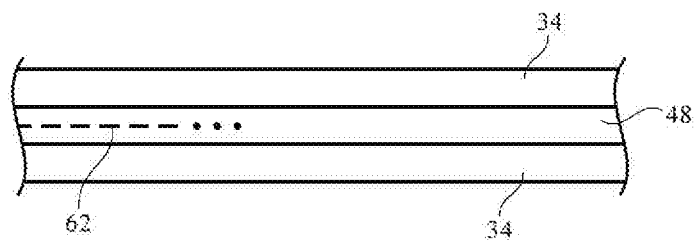
FIG. 7 is a cross-sectional side view of an illustrative fabric that is sandwiched between photovoltaic films in accordance with an embodiment.

If desired, photovoltaic cells 34 may be applied to an upper surface and/or a lower surface of a fabric layer, as shown in FIG. 7. In the example of FIG. 7, fabric 48 is sandwiched between two photovoltaic layers 34. Photovoltaic layers 34 may each include one or more photovoltaic cells.

If desired, fabric 48 may be used as substrate 36 of FIG. 3 (e.g., rear contact 38 of FIG. 3 may be formed directly on fabric 48). For example, fabric 48 may include conductive strands that form signal paths 62. Signal paths 62 may be used to convey electricity from lower contact 38 of cell 34 to load 94. In other arrangements, photovoltaic cell 34 may include a separate substrate that attaches to fabric 48.

Figure 8:
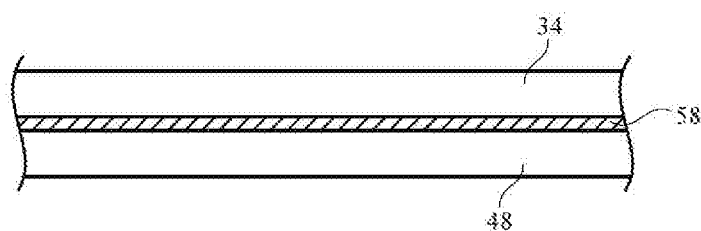
FIG. 8 is a cross-sectional side view of an illustrative a photovoltaic cell attached to a layer of fabric in accordance with an embodiment.

If desired, photovoltaic cell 34 may be mechanically coupled to fabric 48 using an adhesive such as adhesive layer 58 of FIG. 8. The connection between photovoltaic cell 34 and fabric 48 may be purely mechanical (e.g., fabric 48 may not be electrically coupled to photovoltaic cell 34), or if desired, photovoltaic cell 34 may be both mechanically and electrically coupled to conductive strands in fabric 48. For example, a conductive material may electrically connect contact 38 of cell 34 or contact 100 of substrate 36 to fabric 48. If desired, adhesive 58 may be anisotropic conductive adhesive that electrically couples contact 38 or contact 100 of cell 34 to fabric 48.

Figure 9:
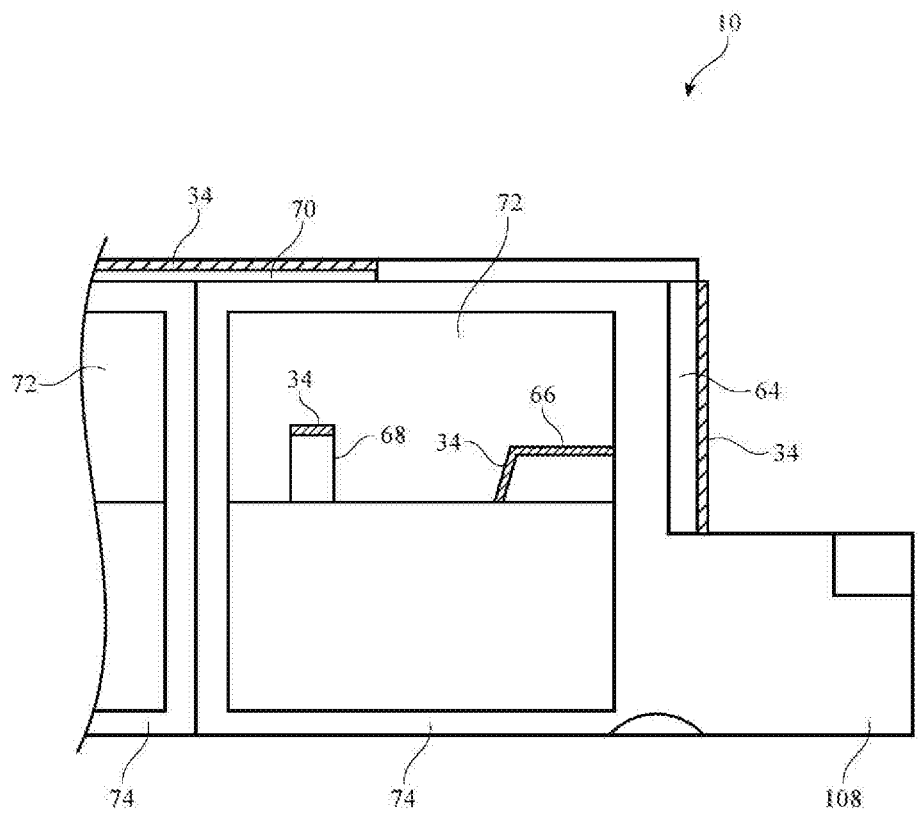
FIG. 9 is a side view of a portion of an illustrative vehicle having one or more surfaces with photovoltaic coatings in accordance with an embodiment.

An illustrative example of a system that may be provided with photovoltaic cells is shown in FIG. 9. In the example of FIG. 9, system 10 may be a vehicle, a kiosk, a room in an office or other building, or other environment having circuitry that requires power. Illustrative configurations in which system 10 is a vehicle may sometimes be described herein as an example.

As shown in FIG. 9, system 10 may include windows such as front window 64, side windows 72, and one or more top windows 70 (e.g., a skylight) that are mounted in body 108. Body 108 may have doors 74. The surfaces of doors 74 may sometimes be referred to as door panels and face the interior of body 108. Dashboard 66 may be located in front of seats 68.

System 10 may contain a battery (see, e.g., battery 32 of FIG. 2). System 10 may also contain circuitry (see, e.g., control circuitry 26 of FIG. 2) for controlling the operation of system 10. For example, in scenarios in which system 10 is an electric vehicle, control circuitry 26 may be used in controlling functions such as steering, braking, acceleration and controlling other vehicle functions. Circuitry 26 may also include power circuitry for use in recharging battery 32. The power circuitry may be used in delivering power from a source such as photovoltaic cells 34 to battery 34 or may, if desired, be used in delivering power from photovoltaic cells 34 directly to other circuitry in system 10.

Photovoltaic cells may be incorporated into any suitable surface in vehicle 10. As examples, photovoltaic films 34 may be provided on windows of system 10 (e.g., front window 64, skylight window 70, side windows 72, rear windows in system 10, or other suitable windows), the interior surface of doors 74 (e.g., on door panels), on dashboard 66 (e.g., locations associated with input-output components and/or other portions of dashboard 66), on horizontal areas (seating surfaces) of seats 68, on the front of rear of seatbacks in seats 68, on the front or rear of headrests on seats 66, on a headliner (e.g., on the interior of a vehicle roof), on interior surfaces of A pillars, B pillars, C pillars, or other structural components), on seatbelts, on a steering wheel, on an arm rest or console between seats 66, on an arm rest on doors 74, on mirrors, on rear seat footwells or other portions of the floor of system 10, or any other interior surfaces of system 10.

If desired, photovoltaic cells 34 may be incorporated into soft surfaces such as fabric, leather, or other flexible materials in system 10. For example, fabrics of the type shown in FIGS. 4-8 may be used as substrates for photovoltaic films 34 in system 10 (e.g., substrate 36 of FIG. 3). This is, however, merely illustrative. If desired, other materials (e.g., polymer, glass, or other materials) may be used as substrates for photovoltaic cells 34.

Figure 10:
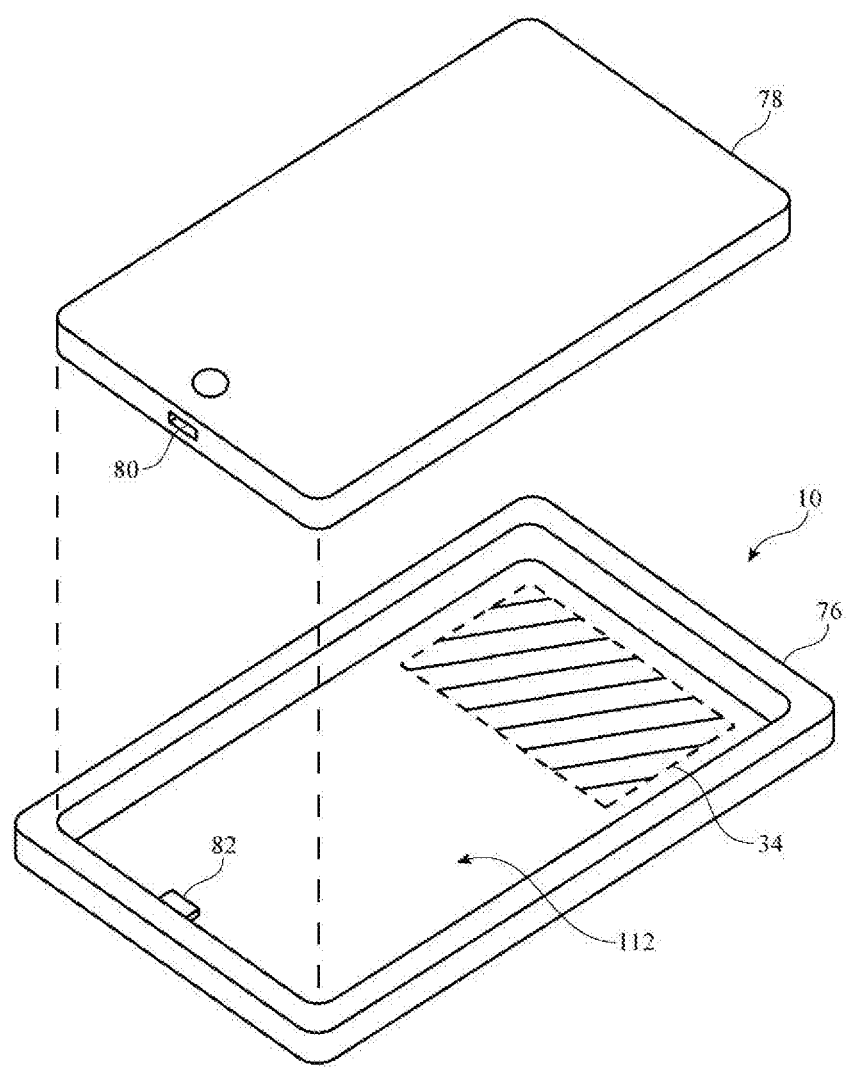
FIG. 10 is a perspective view of an electronic device and accessory having one or more photovoltaic cells in accordance with an embodiment.

FIG. 10 illustrates an example in which photovoltaic cells are provided on an accessory for an electronic device.

Electronic device 78 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 10, device 78 is a portable device such as a cellular telephone, media player, tablet computer, or other portable computing device. Other configurations may be used for device 78 if desired. The example of FIG. 10 is merely illustrative.

Accessory may protect device 78, carry device 78 and/or provide input to or receive output from device 78. As other examples, accessory 10 may be a display cover and device 78 may be an electronic device with a display, accessory 10 may be a band and device 78 may be a wrist-watch device, accessory 10 may be a keyboard and device 78 may be an electronic device that receives keyboard input, accessory 10 may be a stylus and device 78 may be an electronic device that receives stylus input, or accessory 10 and device 78 may have other suitable configurations. Configurations in which accessory 10 is a case and electronic device 78 is a portable device such as a cellular telephone, media player, tablet computer, or other portable computing device are sometimes described herein as an example.

As shown in the exploded perspective view of FIG. 10, device 78 may have a housing with a rectangular outline. Case 10 may have a body portion such as body 76 that has a mating rectangular recess 112 that is configured to receive device 78. If desired, straps or other structures may be used to secure device 78 within case 10.

Body 76 may be formed from plastic, metal, glass, ceramic, sapphire and other crystalline materials, organic materials such as wood or leather, fabric, other materials, and/or combinations of these materials. In some arrangements, case 76 may have a battery (see, e.g., battery 32 of FIG. 2) that provides power to device 78. Plug 82 in case 10 may mate with connector port 80 of device 78 and may be used to deliver power to device 78. Case 10 may not include a battery in configurations in which it is desired to save weight and cost.

Photovoltaic cell 34 may be formed on a rear surface of case 10 (e.g., opposite cavity 112), may be formed on the sides or other surface of case 10, or may be formed within case 10 and may receive light through a window (e.g., a transparent surface or light guide) on case 10. If desired, accessory 10 may have fabric portions, leather portions, plastic portions, and/or other flexible materials that form substrate 36 in cell 34.

Accessory 10 may contain circuitry (see, e.g., control circuitry 26 of FIG. 2) for controlling the operation of accessory. Circuitry 26 may include power circuitry for recharging battery 32 in case 10 and/or for recharging a battery in device 78. The power circuitry may be used in delivering power from photovoltaic cells 34 to battery 32 in accessory 10 and/or to a battery in device 78. If desired, circuitry 26 may be used in delivering power from photovoltaic cells 34 directly to other circuitry in accessory 10 and/or device 78.

If desired, photovoltaic cells 34 may be incorporated into fabric surfaces in accessory 10. For example, fabrics of the type shown in FIGS. 4-8 may be used as substrates for photovoltaic films 34 in accessory 10. This is, however, merely illustrative. If desired, other materials (e.g., leather, polymer, glass, or other materials) may be used as substrates (e.g., substrate 36 of FIG. 3) for photovoltaic cells 34.

Figure 11:
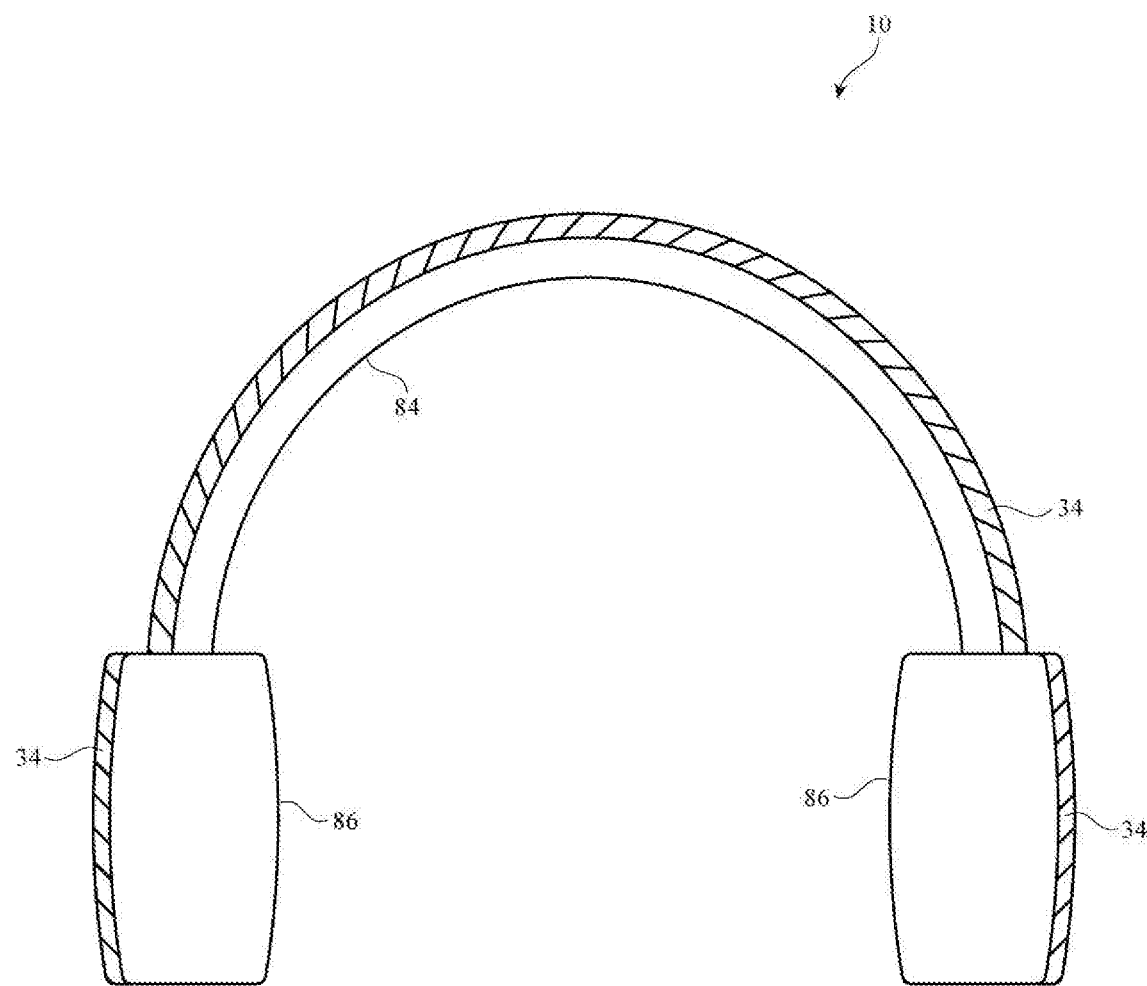
FIG. 11 is a front view of an illustrative electronic device having one or more photovoltaic cells in accordance with an embodiment.

Another illustrative example of a system that may be provided with photovoltaic cells is shown in FIG. 11. In the illustrative configuration of FIG. 11, device 10 is a portable electronic device such as a pair of headphones (e.g., a pair of earbuds, over-the-ear headphones, on-the-ear headphones, or other earphones). Other configurations may be used for device 10 if desired. The example of FIG. 11 is merely illustrative.

As shown in FIG. 11, device 10 may have ear cups such as ear cups 86. There may be two ear cups 86 in device 10 that are coupled by a support such as band 84. Band 84 may be flexible and may have a curved shape to accommodate a user's head. There may be left and right ear cups 86 in device 10, one for one of the user's ears and the other for the other one of the user's ears. Photovoltaic coatings 34 may be incorporated into band 84 and/or cups 86 of device 10. If desired, device 10 may have fabric portions, leather portions, plastic portions, and/or other flexible materials that form substrate 36 in cell 34.

Electronic device 10 may contain circuitry (see, e.g., control circuitry 26 of FIG. 2) for controlling the operation of electronic device 10. For example, in scenarios in which electronic 10 is a pair of headphones, control circuitry 26 may include audio components such a microphones and speakers (e.g., left and right speakers), wireless communications circuitry (e.g., for receiving audio control signals from or sending control signals to another electronic device that is wirelessly paired with electronic device 10), noise cancellation circuitry, and other circuitry. In arrangements where headphones 10 are configured to operate wirelessly, headphones 10 may contain a battery (see, e.g., battery 32 of FIG. 2). Circuitry 26 may include power circuitry for recharging battery 32. The power circuitry may be used in delivering power from a source such as photovoltaic cells 34 to battery 32 or may, if desired, be used in delivering power from photovoltaic cells 34 directly to other circuitry in system 10.

The foregoing is merely illustrative and various modifications can be made to the described embodiments. The foregoing embodiments may be implemented individually or in any combination.

What is claimed is:

1. An item, comprising:
    fabric having intertwined strands, wherein the strands include at least first and second conductive strands;
    circuitry coupled to the first and second conductive strands; and a photovoltaic cell on the fabric, wherein the photovoltaic cell has a first terminal coupled to the first conductive strand and a second terminal coupled to the second conductive strand, wherein the photovoltaic cell converts incoming light into electricity, and wherein the first conductive strand conveys the electricity from the photovoltaic cell to the circuitry.

2. The item defined in claim 1 wherein the photovoltaic cell comprises a thin-film photovoltaic cell.

3. The item defined in claim 2 wherein the thin-film photovoltaic cell comprises at least one semiconductor material selected from the group consisting of: copper indium diselenide, cadmium telluride, copper indium gallium diselenide, and cadmium sulfide.

4. The item defined in claim 2 wherein the thin-film photovoltaic cell wraps around the first conductive strand.

5. The item defined in claim 1 wherein the strands include insulating strands that are intertwined with the first and second conductive strands.

6. The item defined in claim 1 further comprising a battery, wherein the circuitry recharges the battery using the electricity from the photovoltaic cell.

7. The item defined in claim 6 further comprising an input-output device coupled to the fabric, wherein the battery supplies power to the input-output device.

8. An item, comprising:
 communications circuitry that communicates wirelessly with an electronic device;
 a battery that provides power to the communications circuitry;
 a flexible material that forms a curved outer surface of the item; and
 a thin-film photovoltaic cell on the flexible material, wherein the thin-film photovoltaic cell conforms to the curved outer surface and wherein the flexible material has a conductive path that conveys electricity between the thin-film photovoltaic cell and the battery to charge the battery.

9. The item defined in claim 8 wherein the flexible material comprises a material selected from the group consisting of: fabric, leather, and polymer.

10. The item defined in claim 8 wherein the flexible material comprises fabric.

11. The item defined in claim 10 wherein the fabric comprises a conductive strand that forms the conductive path.

12. The item defined in claim 11 wherein the thin-film photovoltaic cell has a positive electrical terminal connected to the conductive strand.

13. The item defined in claim 12 wherein the fabric comprises an additional conductive strand and wherein the thin-film photovoltaic cell has a negative electrical terminal connected to the additional conductive strand.

14. The item defined in claim 8 wherein the flexible material forms part of a case that is configured to receive the electronic device.

15. The item defined in claim 8 wherein the flexible material forms part of a pair of headphones.

16. The item defined in claim 8 wherein the flexible material forms part of a cover for the electronic device.

17. The item defined in claim 8 wherein the thin-film photovoltaic cell comprises a polycrystalline thin-film and has a thickness between 1 and 10 microns.

* * * * *